(12) United States Patent
Huang et al.

(10) Patent No.: US 10,644,181 B2
(45) Date of Patent: May 5, 2020

(54) PHOTOVOLTAIC MODULE

(71) Applicant: Industrial Technology Research Institute, Hsinchu (TW)

(72) Inventors: Chao-Ping Huang, Hualien County (TW); Shang-Yeh Wen, Hsinchu (TW); Cheng-Yu Peng, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/826,707

(22) Filed: Nov. 30, 2017

(65) Prior Publication Data

US 2019/0051782 A1 Feb. 14, 2019

(30) Foreign Application Priority Data

Aug. 11, 2017 (TW) .............................. 106127352 A

(51) Int. Cl.
*H01L 31/05* (2014.01)
*H01L 31/02* (2006.01)

(52) U.S. Cl.
CPC .... *H01L 31/0508* (2013.01); *H01L 31/02008* (2013.01)

(58) Field of Classification Search
CPC ................. H01L 31/05; H01L 31/0508; H01L 31/022441–02245; H01L 31/0224;
(Continued)

(56) References Cited

U.S. PATENT DOCUMENTS

| 3,502,507 A | * | 3/1970 | Mann .................. H01L 31/0516 136/244 |
| 7,276,724 B2 | | 10/2007 | Sheats et al. |

(Continued)

FOREIGN PATENT DOCUMENTS

| CN | 103165692 | 6/2013 |
| CN | 203367323 | 12/2013 |

(Continued)

OTHER PUBLICATIONS

Jan H. Petermann, et al., "Module interconnection of both sides—contacted silicon solar cells by screen-printing," 2013 IEEE 39th Photovoltaic Specialists Conference (PVSC), Jun. 2013, pp. 3448-3453.

(Continued)

*Primary Examiner* — Daniel P Malley, Jr.
(74) *Attorney, Agent, or Firm* — JCIPRNET

(57) ABSTRACT

A photovoltaic module is provided, and a cell set thereof includes a first cell, a second cell, and a conductive connection element. In the first cell, a first semiconductor stack has a first surface, a second surface, and a first side surface. A first electrode is disposed on the first surface. A second electrode is disposed on the second surface. In the second cell, a second semiconductor stack has a third surface, a fourth surface, and a second side surface. A third electrode is disposed on the third surface. A fourth electrode is disposed on the fourth surface. The conductive connection element connects the first electrode with a part of a first insulation layer on the second surface, and connects the third electrode with a part of a second insulation layer on the fourth surface.

15 Claims, 5 Drawing Sheets

(58) Field of Classification Search
CPC ......... H01L 31/022458; H01L 31/0465; H01L 31/0512; H01L 31/0516
See application file for complete search history.

(56) References Cited

U.S. PATENT DOCUMENTS

| | | | |
|---|---|---|---|
| 7,419,377 B1* | 9/2008 | Briere | ................ H01L 31/0508 |
| | | | 439/32 |
| 8,361,827 B2 | 1/2013 | Chan et al. | |
| 8,883,552 B2 | 11/2014 | Asthana et al. | |
| 9,153,720 B1* | 10/2015 | Frost | ................ H01L 31/0508 |
| 2009/0308430 A1 | 12/2009 | Everett et al. | |
| 2011/0005569 A1 | 1/2011 | Sauar et al. | |
| 2012/0167980 A1* | 7/2012 | Engelhart | ....... H01L 31/022458 |
| | | | 136/256 |
| 2015/0287865 A1 | 10/2015 | Aiken et al. | |
| 2016/0225920 A1 | 8/2016 | Fujii et al. | |

FOREIGN PATENT DOCUMENTS

| | | |
|---|---|---|
| CN | 103165693 | 3/2016 |
| CN | 205542838 | 8/2016 |
| CN | 104241404 | 12/2016 |
| CN | 105304731 | 3/2017 |
| TW | I446555 | 7/2014 |
| TW | 201503399 | 1/2015 |
| TW | M516232 | 1/2016 |
| TW | M517475 | 2/2016 |
| TW | 201705508 | 2/2017 |
| TW | 201707225 | 2/2017 |

OTHER PUBLICATIONS

Victor Rosca, et al., "Systematic reliability studies of back-contact photovoltaic modules," SPIE Optics and Photonics Conference, Oct. 2012, pp. 84720D-1-84720D-5.

M. Ebert, et al., "Robust module integration of back contact cells by interconnection adapters," 29th European Photovoltaic Solar Energy Conference and Exhibition, Sep. 2014, pp. 225-228.

S. Guo, et al., "A Quantitative Analysis of Photovoltaic Modules Using Halved Cells," International Journal of Photoenergy, vol. 2013, Article ID 739374, pp. 1-9.

James M. Gee, et al., "Simplified module assembly using back-contact crystalline-silicon solar cells," Photovoltaic Specialists Conference, 1997, Conference Record of the Twenty-Sixth IEEE, Sep. 1997, pp. 1085-1088.

"Notice of allowance of Taiwan Counterpart Application", dated Jun. 1, 2018, p. 1-p. 4.

"Office Action of China Counterpart Application," dated Nov. 6, 2019, p. 1-p. 7.

* cited by examiner

PHOTOVOLTAIC MODULE

CROSS-REFERENCE TO RELATED APPLICATION

This application claims the priority benefits of Taiwan application serial no. 106127352, filed on Aug. 11, 2017. The entirety of the above-mentioned patent application is hereby incorporated by reference herein and made a part of this specification.

TECHNICAL FIELD

The technical field relates to a photovoltaic module.

BACKGROUND

In recent years, as the awareness of environmental protection increases and the concept of protecting the earth arises, since thermoelectric power generation boosts carbon emission as well as causes pollution to the environment and greenhouse effect, and nuclear power generation causes safety concerns and also results in long term and serious pollution to the environment, the development of green energy technologies has received more attention. Among all the green energy technologies, solar technology neither increases carbon emission nor causes safety concerns and therefore is an environment-friendly and clean energy technology.

However, the solar technology has been found to have the problem of low energy conversion efficiency. Under such circumstances, a back-electrode solar cell was developed. Since the electrode is disposed on the rear side to reduce blocking of sunlight, the light-irradiating area of a solar cell can be increased.

Conventional back-electrode solar cell may be roughly categorized into four types according to their structures, namely an interdigitated back contact (IBC) back-electrode solar cell, an emitter wrap through (EWT) back-electrode solar cell, a metallization wrap through (MWT) back-electrode solar cell and a metallization wrap around (MWA) back-electrode solar cell. The IBC back-electrode solar cell has the problem of serial stress due to the special shape, and it is required to place an interconnected stripe protective sheet between cells. For the MWT back-electrode solar cell, the problem lies in that it is required to carry out through holes of a silicon chip and a process to insulate the walls of the thorough holes, and the reliability of such process is low. As for the EWT back-electrode solar cell, the problem is that the connection circuit requires an encapsulating material to be integrated with a back material; besides, the long-term stability is yet to be confirmed.

SUMMARY

An embodiment of the disclosure provides a photovoltaic module including at least one cell set. Each cell set includes a first cell, a second cell and a conductive connection element. The first cell includes a first semiconductor stack, a first electrode, a second electrode and a first insulating layer. The first semiconductor stack has a first surface, a second surface opposite to the first surface, and a first side surface that connects the first surface with the second surface. The first electrode is disposed on the first surface, and the second electrode is disposed on the second surface. The first insulating layer includes a first side insulating layer disposed on the first side surface and a first rear insulating layer disposed on the second surface. The second cell includes a second semiconductor stack, a third electrode, a fourth electrode and a second insulating layer. The second semiconductor stack has a third surface, a fourth surface opposite to the third surface, and a second side surface that connects the third surface with the fourth surface. The third electrode is disposed on the third surface, and the fourth electrode is disposed on the fourth surface. The second insulating layer includes a second side insulating layer disposed on the second side surface and a second rear insulating layer disposed on the fourth surface. The conductive connection element connects the first rear insulating layer with the first electrode, and connects the second rear insulating layer with the third electrode.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
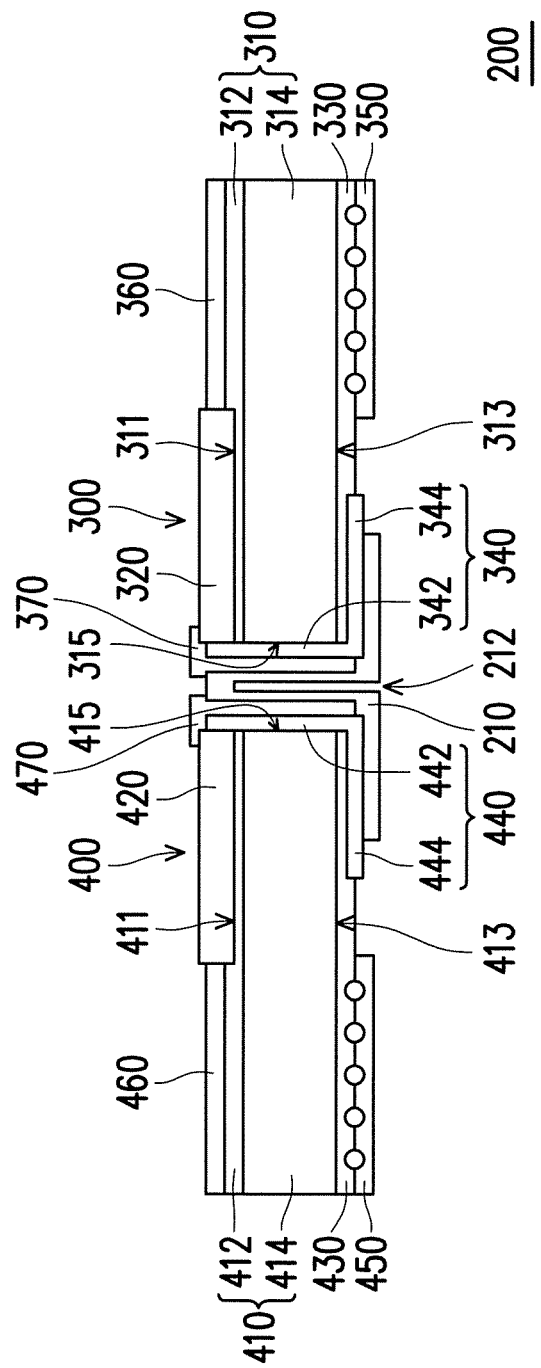
FIG. 1 is a cross-sectional view illustrating a photovoltaic module according to an embodiment of the disclosure.
Figure 2:
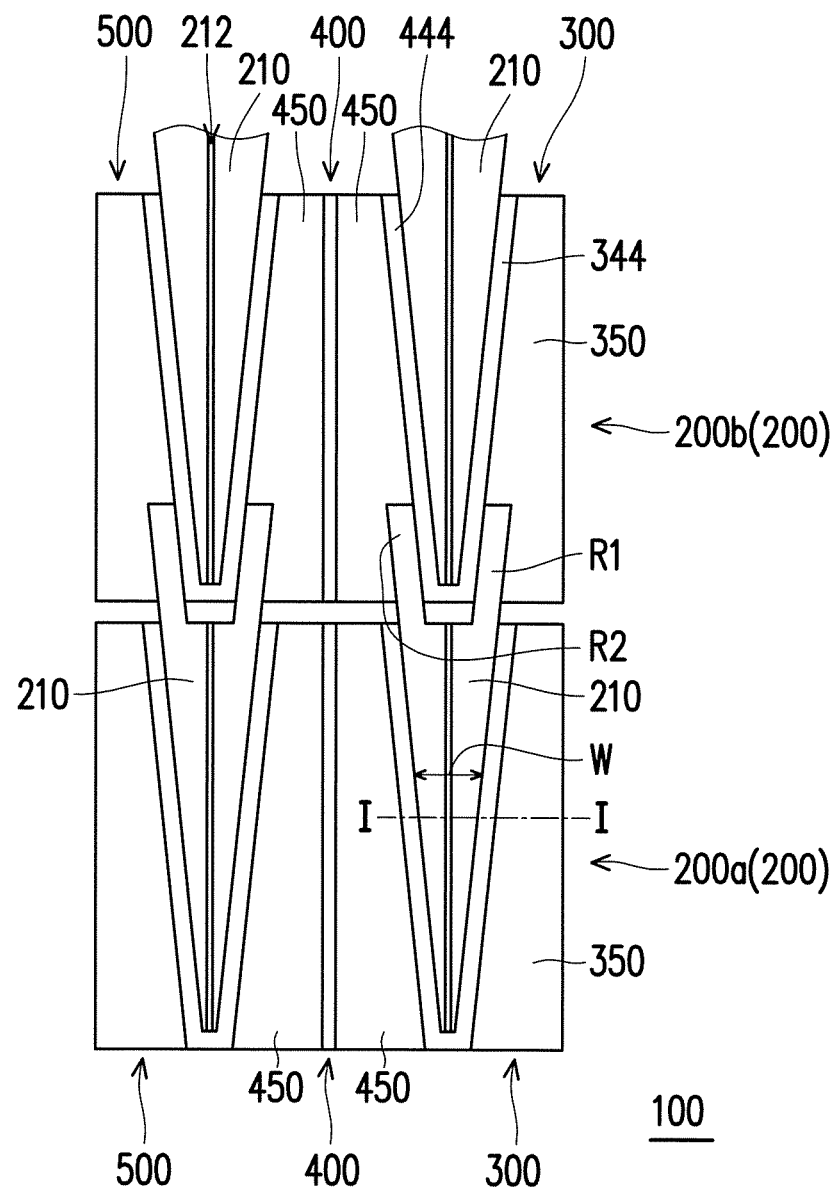
FIG. 2 is a bottom view illustrating the photovoltaic module in FIG. 1.
Figure 3:
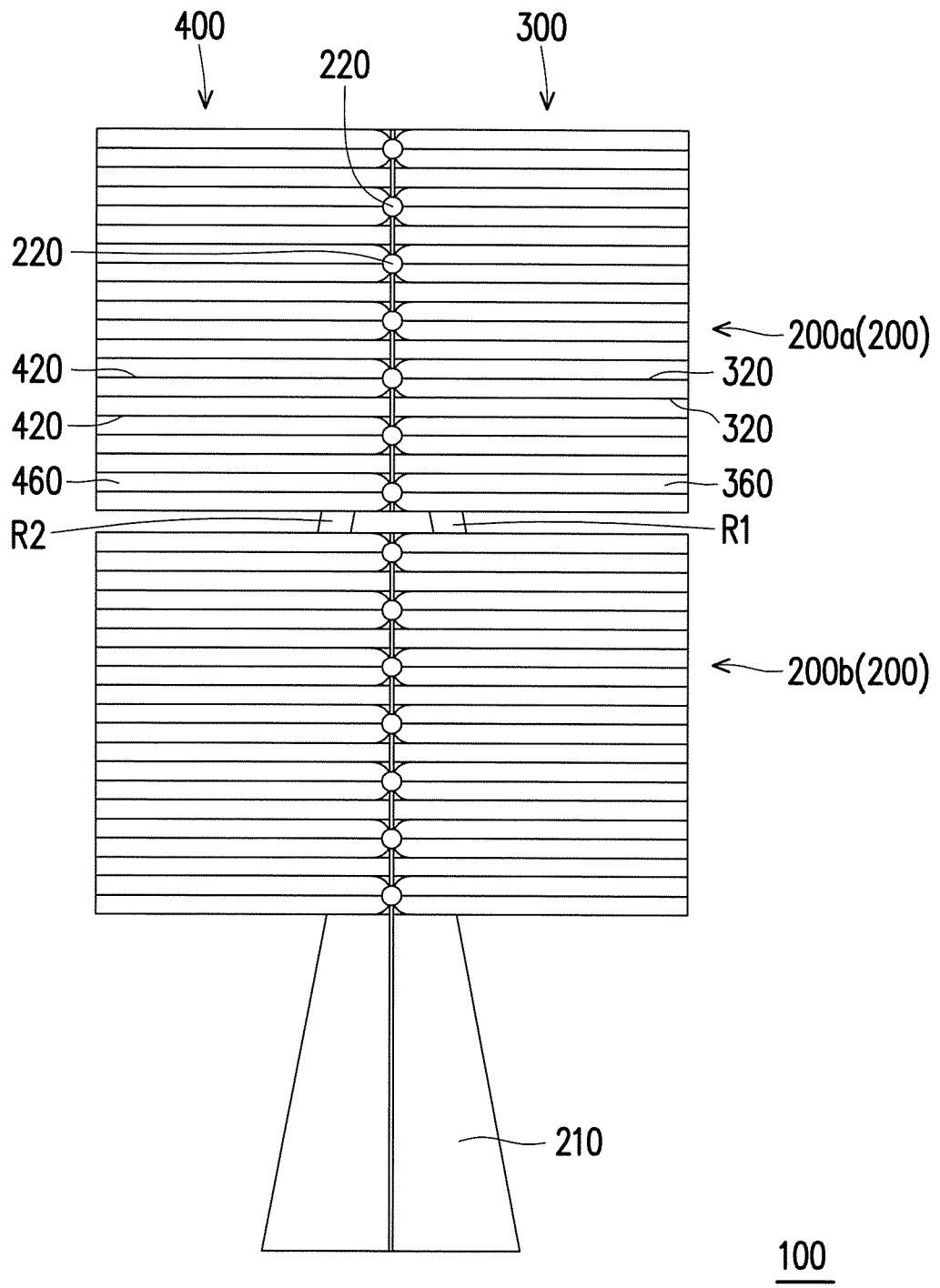
FIG. 3 is a top view illustrating the photovoltaic module in FIG. 1.

FIG. 1 is a cross-sectional view illustrating a photovoltaic module according to an embodiment of the disclosure. FIG. 2 is a bottom view illustrating the photovoltaic module in FIG. 1, wherein FIG. 1 is a cross-sectional view taken along line I-I of FIG. 2. FIG. 3 is a top view illustrating the photovoltaic module in FIG. 1. Referring to FIG. 1 to FIG. 3, a photovoltaic module 100 in the embodiment includes at least one cell set 200. In the embodiment, the photovoltaic module 100 includes a plurality of cell sets 200. In FIG. 2, a cell set 200a and a cell set 200b are illustrated for exemplary purpose. Each of the cell sets 200 includes a first cell 300, a second cell 400 and a conductive connection element 210.

The first cell 300 includes a first semiconductor stack 310, a first electrode 320, a second electrode 330 and a first insulating layer 340. The first semiconductor stack 310 has a first surface 311, a second surface 313 opposite to the first surface 311 and a first side surface 315 that connects the first surface 311 with the second surface 313. The first electrode 320 is disposed on the first surface 311, and the second electrode 330 is disposed on the second surface 313. The first insulating layer 340 includes a first side insulating layer 342 disposed on the first side surface 315 and a first rear insulating layer 344 disposed on the second surface 313. In the embodiment, the first rear insulating layer 344 is disposed on the second electrode 330, covers a portion of the second electrode 330, and is indirectly disposed on the second surface 313.

In the embodiment, the first semiconductor stack 310 includes a first type doped semiconductor layer 312 and a second type doped semiconductor layer 314. The first type doped semiconductor layer 312 is disposed between the first electrode 320 and the second type doped semiconductor layer 314. Meanwhile, the second type doped semiconductor layer 314 is disposed between the first type doped semiconductor layer 312 and the second electrode 330. One of the first type doped semiconductor layer 312 and the second type doped semiconductor layer 314 is a p-type semiconductor layer, and the other one of the first type doped semiconductor layer 312 and the second type doped semiconductor layer 314 is an n-type semiconductor layer. In the embodiment, the second type doped semiconductor layer 314 is a p-type semiconductor layer such as a p-type silicon substrate, and the first type doped semiconductor layer 312 is an n-type semiconductor layer such as an n-type emitter layer.

The doping material of the first type doped semiconductor layer 312 may be pentavalent dopants such as phosphor and the like in the chemical elements table. The doping material of the second type doped semiconductor layer 314 may be trivalent dopants such as a boron and the like in the chemical elements table. The semiconductor layer for use may be various types of semiconductors such as a silicon semiconductor, a group III-V semiconductor, a group II-VI semiconductor, a compound semiconductor, an organic semiconductor and so on.

In the embodiment, the first electrode 320 is a metal electrode such as a silver wire; the second electrode 330 is a metal layer such as an aluminum electrode layer. In the embodiment, in each of the cell sets 200, the first cell 300 further includes a first conductive sheet 350 which is electrically connected to the second electrode 330. The first conductive sheet 350 is, for example, an aluminum foil which can be electrically connected to the second electrode 330 via a laser welding process, or electrically connected to the second electrode 330 via direct contact. Alternatively, in other embodiment, the second electrode 330 may be an aluminum foil that is electrically connected to the second type doped semiconductor layer 314 without using an additional first conductive sheet 350.

In the embodiment, the first cell 300 may further include an anti-reflection layer 360 disposed on the first surface 311 of the first semiconductor stack 310 so as to improve the proportion of sunlight entering the first semiconductor stack 310.

The second cell 400 includes a second semiconductor stack 410, a third electrode 420, a fourth electrode 430 and a second insulating layer 440. The second semiconductor stack 410 has a third surface 411, a fourth surface 413 opposite to the third surface 411, and a second side surface 415 that connects the third surface 411 with the fourth surface 413. The third electrode 420 is disposed on the third surface 411, and the fourth electrode 430 is disposed on the fourth surface 413. The second insulating layer 440 includes a second side insulating layer 442 disposed on the second side surface 415 and a second rear insulating layer 444 disposed on the fourth surface 413. In the embodiment, the second rear insulating layer 444 is disposed on the fourth electrode 430, covers a portion of the fourth electrode 430, and is indirectly disposed on the fourth surface 413.

In the embodiment, the second semiconductor stack 410 includes a first type doped semiconductor layer 412 and a second type doped semiconductor layer 414. The first type doped semiconductor layer 412 is disposed between the third electrode 420 and the second type doped semiconductor layer 414, and the second type doped semiconductor layer 414 is disposed between the first type doped semiconductor layer 412 and the fourth electrode 430. One of the first type doped semiconductor layer 412 and the second type doped semiconductor layer 414 is a p-type semiconductor layer, and the other one of the first type doped semiconductor layer 412 and the second type doped semiconductor layer 414 is an n-type semiconductor layer. In the embodiment, the second type doped semiconductor layer 414 is a p-type semiconductor layer such as a p-type silicon substrate, and the first type doped semiconductor layer 412 is an n-type semiconductor layer such as an n-type emitter layer.

The doping material of the first type doped semiconductor layer 412 may be pentavalent dopants such as phosphor and the like in the chemical elements table. The doping material of the second type doped semiconductor layer 414 may be trivalent dopants such as a boron and the like in the chemical elements table. The semiconductor layer for use may be various types of semiconductors such as a silicon semiconductor, a group III-V semiconductor, a group II-VI semiconductor, a compound semiconductor, an organic semiconductor and so on.

In the embodiment, the third electrode 420 is a metal electrode such as a silver wire; the fourth electrode 430 is a metal layer such as an aluminum electrode layer. In the embodiment, in each of the cell sets 200, the second cell 400 further includes a second conductive sheet 450 which is electrically connected to the fourth electrode 430. The second conductive sheet 450 is, for example, an aluminum foil which can be electrically connected to the fourth electrode 430 via a laser welding process, or electrically connected to the fourth electrode 430 via direct contact. Alternatively, in other embodiment, the fourth electrode 430 may be an aluminum foil that is electrically connected to the second type doped semiconductor layer 414 without using an additional second conductive sheet 450.

In the embodiment, the second cell 400 may further include an anti-reflection layer 460 disposed on the third surface 411 of the second semiconductor stack 410 so as to improve the proportion of sunlight entering the second semiconductor stack 410. In addition, the structures of the first cell 300 and the second cell 400 may be the same or similar.

The conductive connection element 210 connects the first rear insulating layer 344 with the first electrode 320, and connects the second rear insulating layer 444 with the third electrode 420. In this manner, by using the conductive connection element 210, the electron flow at the first electrode 320 and the third electrode 420 that are disposed on the front side (i.e., the side with the first surface 311 and the third surface 411) of the cell can be guided to the rear side (i.e., the side with the second surface 313 and the fourth surface 413) of the cell. The material of the conductive connection element 210 may include aluminum, copper, tin, lead, steel, gold, silver, iron, graphite or a combination thereof. In the embodiment, the conductive connection element 210 is, for example, a copper foil. In the embodiment, the conductive connection element 210 extends, beginning from the first rear insulating layer 344, from the rear surface of the first cell 300 to the front side thereof along the first rear insulating layer 344 and the first side insulating layer 342 in sequence, then extends from the front side of the second cell 400 to the rear surface thereof along the second side insulating layer 442 and the second rear insulating layer 444 in sequence, and finally reaches the second rear insulating layer 444. The first rear insulating layer 344 may insulate the second electrode 330 from the conductive connection element 210. The first side insulating layer 342 may insulate the conductive connection element 210 from the first side surface 315 of the first semiconductor stack 310. The second rear insulating layer 444 may insulate the fourth electrode 430 from the conducive connection element 210, and the second side insulating layer 442 may insulate the conductive connection element 210 from the second side surface 415 of the second semiconductor stack 410.

Figure 5A:
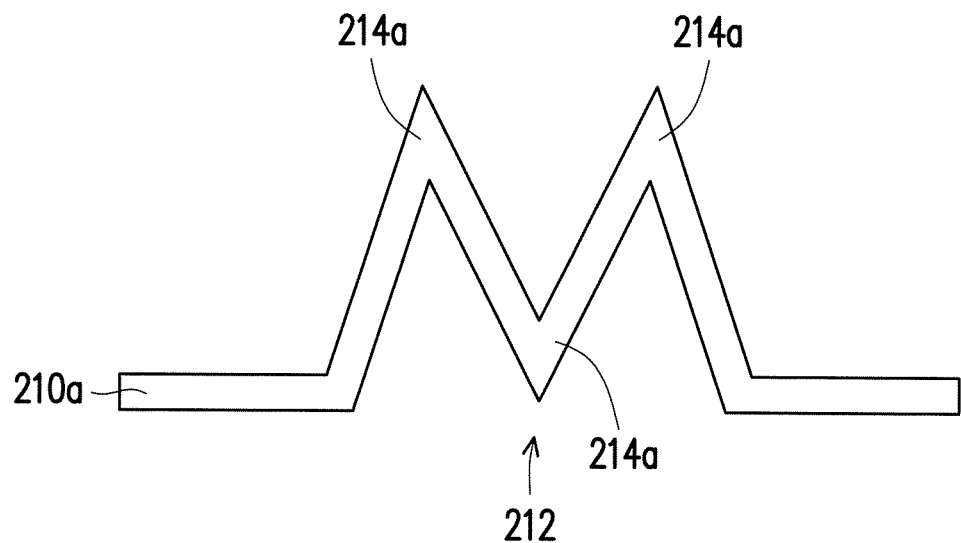
FIG. 5A is a cross-sectional view illustrating a modification of a conductive connection element in FIG. 1.
Figure 5B:
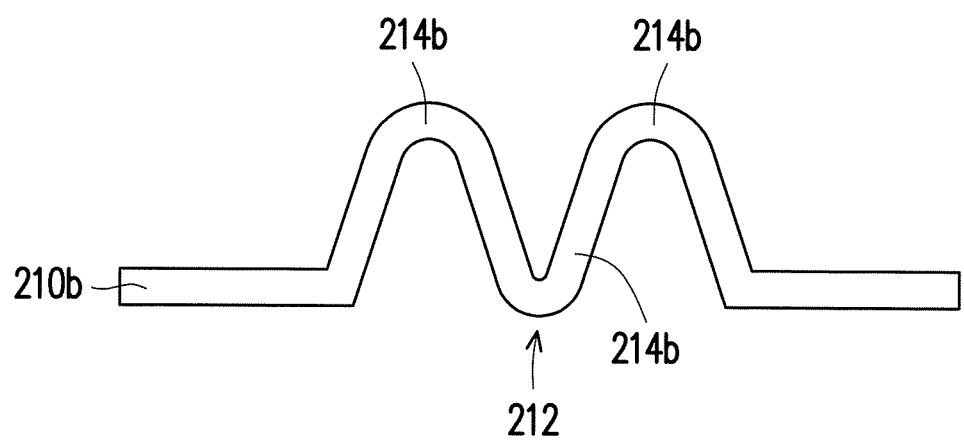
FIG. 5B is a cross-sectional view illustrating another modification of the conductive connection element in FIG. 1.

In the embodiment, the first semiconductor stack 310 and the second semiconductor stack 410 in each of the cell sets 200 are separated from each other. A portion of the conductive connection element 210 is disposed between the first side surface 315 and the second side surface 415; the first side insulating layer 342 is disposed between the first side surface 315 and the conductive connection element 210; and the second side insulating layer 442 is disposed between the second side surface 415 and the conductive connection element 210. In addition, the first side insulating layer 342 separates the first semiconductor stack 310 from the conductive connection element 210, and the second side insulating layer 442 separates the second semiconductor stack 412 from the conductive connection element 210. In the embodiment, in each of the cell sets 200, the first surface 311 and the third surface 411 are disposed on the same side (i.e., the upper side of FIG. 1) of the cell set 200. The second surface 313 and the fourth surface 413 are disposed on another opposite side (i.e., the rear side of FIG. 1) of the cell set 200. The conductive connection element 210 has an opening 212 on the another side (i.e., the rear side of FIG. 1) of the cell set 200 so as for the cell set 200 to have flexibility, for example, to be able to be bended upward in the opening 212. A portion of the conductive connection element 210 on the right of the opening 212 may lean against a portion of the conductive connection element 210 on the left of the opening 212. However, in other embodiment, the conductive connection element 210 may not have the opening 212, that is, the portion on the right of the original opening 212 and the portion on the left of the opening 212 are integrated as a whole. In the embodiment, the conducive connection element 210 between the first electrode 320 and the third electrode 420 has a flexible structure, which is exemplified as a bending structure in the embodiment. In other embodiment, the flexible structure in the opening 212 may include a V-shaped structure in at least one part, or a sine waveform structure in at least one part. For example, as shown in FIG. 5A, a conductive connection element 210a may have a plurality of V-shaped structures 214a at the opening 212. However, in other embodiment, the conductive connection element 210a may have one V-shaped structure 214a at the opening 212. Also for example, as shown in FIG. 5B, a conductive connection element 210b may have a plurality of sine waveform structures 214b at the opening 212. However, in other embodiment, the conductive connection element 210b may have one sine waveform structure 214b at the opening 212.

In the embodiment, each of the cell sets 200 further includes a first conductive paste 370 and a second conductive paste 470. The first conductive paste 370 connects the conductive connection element 210 with the first electrode 320, and the second conductive paste 470 connects the conductive connection element 210 with the third electrode 420. In this manner, the electron flows at the first electrode 320 and the third electrode 420 respectively flow through the first conductive paste 370 and the second conductive paste 470 to the conductive connection element 210, and flow through the conductive connection element 210 to the rear surface of the cell set 200. In addition, in the embodiment, on the front surface of each of the cell sets 200, a dot-shaped conductive paste 220 may be used to connect the plurality of first electrodes 320 that extend linearly and the plurality of third electrodes 420 that extend linearly to the conductive connection element 210. In FIG. 3, the embodiment is exemplified with three strips of first electrodes 320 and three strips of third electrodes 420 being connected to one dot-shaped conductive paste 220, which should not be construed as a limitation to the disclosure. The first conductive paste 370, the second conductive paste 470 and the dot-shaped conductive paste 220 are, for example, a low-temperature conductive paste.

In the embodiment, in each of the cell sets 200, the polarity of the first electrode 320 is opposite to the polarity of the second electrode 330; the polarity of the third electrode 420 is opposite to the polarity of the fourth electrode 430. The polarity of the first electrode 320 is the same as the polarity of the third electrode 420; and polarity of the second electrode 330 is the same as the polarity of the fourth electrode 430. In addition, the first insulating layer 340 and the second insulating layer 440 are insulating pastes, insulating sheets or insulating coatings. For example, the first side insulating layer 342 and the second side insulating layer 442 may be insulating pastes or insulating coatings, and the first rear insulating layer 344 and the second rear insulating layer 444 may be insulating sheets.

In the photovoltaic module 100 of the embodiment, since the conductive connection element 210 is used to connect the first rear insulating layer 344 with the first electrode 320, and connect the second rear insulating layer 444 with the third electrode 420, the electron flow of the first electrode 320 and the third electrode 420 can be guided to the rear surface of the cell set via a simple structure, thereby realizing the back-electrode solar cell. In addition, in the embodiment, the first semiconductor stack 310 and the second semiconductor stack 410 in each of the cell sets 200 are separated from each other. In other words, the embodiment adopts a plurality of independent cell units (e.g., first cell 300 and second cell 400), and the independent cell units are assembled into the cell set 200 via the conductive connection element 210 in a module manufacturing process. Therefore, it is not required to adopt a process of drilling the cell unit to form vias and insulating the walls of the vias. Accordingly, the problem of low reliability in the process of the vias and insulating the walls of the vias is not occurred, thereby improving the yield of rate and reliability of the photovoltaic module 100 of the embodiment. In other words, the structure of the photovoltaic module 100 in the embodiment facilitates to integrate a portion of manufacturing process of the cell and a portion of manufacturing process of the module so as to achieve the effect of simplifying manufacturing process, thereby reducing manufacturing costs, improving yield of rate and increasing reliability of product. Accordingly, the value of the photovoltaic module 100 for power generation is more competitive.

In the embodiment, the conductive connection element 210 of one of (e.g., a cell set 200a) two adjacent cell sets 200 is electrically connected to the second electrode 330 and the fourth electrode 430 of the other one of (e.g., a cell set 200b) the two adjacent cell sets 200, for example, to be electrically connected to the second electrode 330 and the fourth electrode 430 via the first conductive sheet 350 and the second conductive sheet 450 of the cell set 200b. In the embodiment, the conductive connection element 210 of one of (e.g., the cell set 200a) the two adjacent cell sets 200 may be connected to the first conductive sheet 350 and the second conductive sheet 450 of the other one of (e.g., the cell set 200b) the two adjacent cell sets 200 via a ultrasonic welding process, a laser welding process, an infrared-curing process or a UV-ray curing process. In the embodiment, the conductive connection element 210 includes a first extending portion R1 and a second extending portion R2. The first extending portion R1 extends to the second electrode 330 that is connected to the other one of (e.g., cell set 200b) the two adjacent cell sets 200. The second extending portion R2 extends to the fourth electrode 430 that is connected to the other one of (e.g., cell set 200b) the two adjacent cell sets 200; for example, the first extending portion R1 and the second extending portion R2 of the conductive connection element 210 of the cell set 200a may be welded with the first conductive sheet 350 and the second conductive sheet 450, respectively. In this manner, the cell set 200a and the cell set 200b can be connected in series, and the first cell 300 and the second cell 400 in each of the cell sets 200 are connected in parallel. By adopting the method of connecting the conductive connection element 210 in series in the rear surface of the cell set, the shield of tab ribbons can be reduced so that the light-receiving area of the cell can be increased.

In the embodiment, a width W of the conductive connection element 210 located on the first rear insulating layer 344 and the second rear insulating layer 444 of the cell set 200a gradually increases from a side away from the cell set 200b toward a side close to the cell set 200b so as to gradually collect more electron flow.

In the embodiment, each of the cell sets 200 may further include a third cell 500, and the structure thereof is the same as or similar to the structure of the first cell 300 and the second cell 400. The second cell 400 and the third cell 500 may be electrically connected (e.g., connected in parallel) via another conductive connection element 210. The connection relationship between the second cell 400, the third cell 500 and the another conductive connection element 210 is the same as the connection relationship between the first cell 300, the second cell 400 and the conductive connection element 210; no repetition is incorporated herein. In other embodiment, each of the cell sets 200 may include more cell units (e.g., include a fourth, a fifth, a sixth . . . and an $n^{th}$ cell), and the two adjacent cell units are electrically connected together via one conductive connection element 210, and the connection relationship thereof is the same as the connection relationship between the first cell 300, the second cell 400 and the conductive connection element 210, wherein n is larger than or equal to 3. However, in an embodiment, each of the cell sets 200 may have only two batteries, namely, the first cell 300 and the second cell 400.

Figure 4:
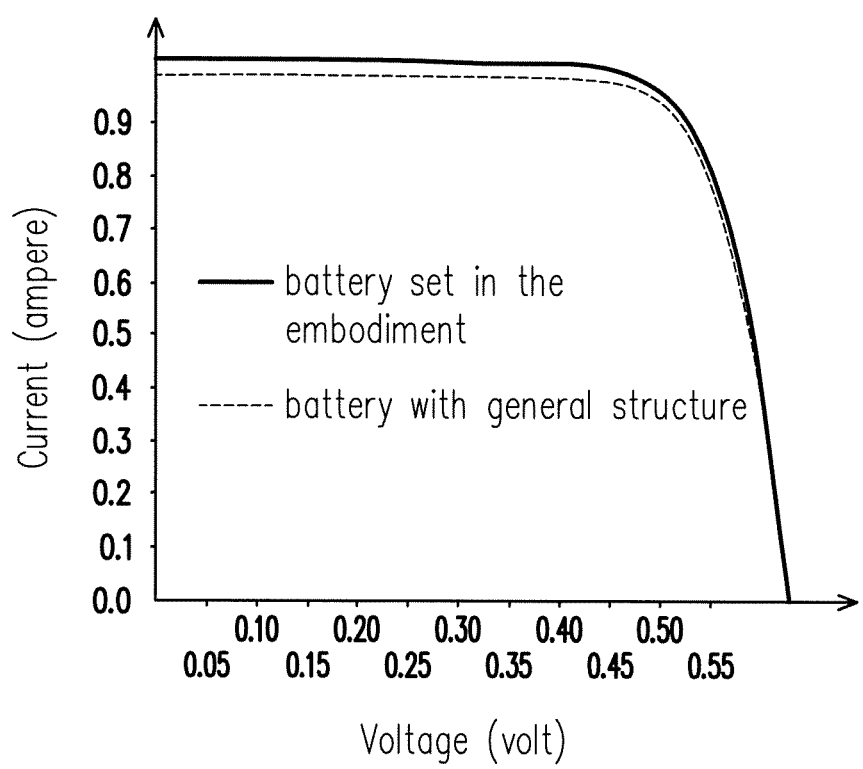
FIG. 4 is a comparative diagram illustrating comparisons of output current versus voltage curve between a cell set in FIG. 1 and a solar cell with general structure.

FIG. 4 is a comparative diagram illustrating comparisons of output current versus voltage curve between a cell set in FIG. 1 and a solar cell with general structure. Referring to FIG. 1 and FIG. 4, the curve in FIG. 4 shows that an open circuit voltage of the cell set 200 in the embodiment is 0.627 volt; a short circuit current is 1.016 amperes; a fill factor is 75.22%; a series resistance is 0.079 ohm; and efficiency is 17.36%. As for the solar cell with general structure, the open circuit voltage is 0.627 volt; the short circuit current is 0.987 ampere; the fill factor is 75.57%; the series resistance is 0.054 ohm; and the efficiency is 16.95%. Based on the above, it can be obtained that the photovoltaic conversion efficiency of the cell set 200 in the embodiment and other characteristics thereof are superior to the photovoltaic conversion efficiency and other characteristics of the solar cell with general structure.

Further referring to FIG. 1 and FIG. 2, an assembling method of the photovoltaic module 100 in the embodiment may be described as follows.

Step 1: An out-of-plane three-dimensional structure of the conductive connection element 210 (e.g., copper foil) is fabricated as follows. In FIG. 1, the conductive connection element 210 is, for example, a three-dimensional structure that is formed by the copper foil as folded in FIG. 1.

Step 2: The electrical connection between the conductive connection element 210 (e.g., copper foil) and the first conductive sheet 350 as well as the second conductive sheet 450 (e.g., copper foil) is as shown in FIG. 2, in which they are connected in areas R1 and R2, and the connecting method thereof may be carried out via an ultrasonic welding process, a low-temperature paste adhesion process and so on.

Step 3: After the first side surface 315 and the second side surface 415 of the first cell 300 and the second cell 400 are applies with the insulating paste, a baking process is carried out so as to cure the insulating paste to form the first side insulating layer 342 and the second side insulating layer 442 respectively as shown in FIG. 1.

Step 4: An insulating area (i.e., fabrication of first rear insulating layer 344 and second rear insulating layer 444) is fabricated on the rear surface of the first cell 300 and the second cell 400 so as to isolate the conductive connection element 210 (e.g., copper foil) from the rear-surface electrode (e.g., second electrode 330 and fourth electrode 430) of the cell.

Step 5: After the low-temperature conductive paste (i.e., first conductive paste 370 and second conductive paste 470) is coated on the copper foil three-dimensional structure (i.e., conductive connection element 210), with the first cell 300 and the second cell 400 that have the side edge of the first side insulating layer 342 and the second side insulating layer 442 are brought into close contact with both sides of the copper foil three-dimensional structure, such that the low-temperature conductive paste can connect the front-surface electrode (i.e., first electrode 320 and second electrode 420) of the cell with the copper foil three-dimensional structure. Additionally, the low-temperature conductive paste is baked at a temperature below 150° C., thereby completing fabrication of the structure of the cell set 200a as shown in FIG. 1 and FIG. 2.

Step 6: The first conductive sheet 350 and the second conductive sheet 450 (e.g., aluminum foil) that are electrically connected to the conductive connection element 210 (e.g., copper foil) in step 2 are distributed on the rear surface of adjacent cell sets 200b as shown in FIG. 2. With the pressure generated from laminating the module, the aluminum foil and the rear surface electrode of the cell set 200b are closely in contact, thereby completing the serial connection of circuit of adjacent cell sets 200b.

In summary, in the photovoltaic module of the embodiment of the disclosure, since the conductive connection element is used to connect the first rear insulating layer with the first electrode, and connect the second rear insulating layer with the third electrode, the back-contact solar cell can be realized with a simple structure. Additionally, such structure facilitates to integrate a portion of the manufacturing process of the cell and a portion of the manufacturing process of the module, thereby achieving the effect of simplifying the manufacturing process.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A photovoltaic module, comprising at least one cell set, each cell set comprising:
   a first cell, comprising:
      a first semiconductor stack, having a first surface, a second surface opposite to the first surface, and a first side surface connecting the first surface with the second surface;
      a first electrode, disposed on the first surface;
      a second electrode, disposed on the second surface; and
      a first insulating layer, comprising a first side insulating layer disposed on the first side surface and a first rear insulating layer disposed on the second surface, wherein the first side insulating layer and the first rear insulating layer are two portions of the first insulating layer, respectively;
   a second cell, comprising:
      a second semiconductor stack, having a third surface, a fourth surface opposite to the third surface, and a second side surface connecting the third surface with the fourth surface;
      a third electrode, disposed on the third surface;
      a fourth electrode, disposed on the fourth surface; and
      a second insulating layer, comprising a second side insulating layer disposed on the second side surface and a second rear insulating layer disposed on the fourth surface, wherein the second side insulating layer and the second rear insulating layer are two portions of the second insulating layer, respectively;
   a conductive connection element, extending along the first side surface from the first surface toward the second surface, connecting the first rear insulating layer with the first electrode, and connecting the second rear insulating layer with the third electrode, wherein the conductive connection element extends along the first rear insulating layer and the first side insulating layer in sequence, is then bent toward the second cell, and then extends along the second side insulating layer and the second rear insulating layer in sequence, a part of the conductive connection element is between the first cell and the second cell, and two other parts of the conductive connection element are on a side of the second surface and on a side of the fourth surface respectively;
   a first conductive paste, connecting the conductive connection element with the first electrode; and
   a second conductive paste, connecting the conductive connection element with the third electrode,
   wherein a polarity of the first electrode is the same as a polarity of the third electrode.

2. The photovoltaic module according to claim 1, wherein the first semiconductor stack and the second semiconductor stack in each cell set are separated from each other.

3. The photovoltaic module according to claim 1, wherein a portion of the conductive connection element is disposed between the first side surface and the second side surface, the first side insulating layer separates the first semiconductor stack from the conductive connection element, and the second side insulating layer separates the second semiconductor stack from the conductive connection element.

4. The photovoltaic module according to claim 1, wherein in each cell set, the first surface and the third surface are disposed on a same side of the cell set, the second surface and the fourth surface are disposed on another opposite side of the cell set, and the conductive connection element has an opening on the another opposite side of the cell set such that the cell set has flexibility.

5. The photovoltaic module according to claim 1, wherein the at least one cell set is a plurality of cell sets, the conductive connection element of one of two adjacent cell sets is electrically connected to the second electrode and the fourth electrode of the other one of the two adjacent cell sets.

6. The photovoltaic module according to claim 5, wherein the conductive connection element comprises:
   a first extending portion, extending to the second electrode connected to said the other one of the two adjacent cell sets; and
   a second extending portion, extending to the fourth electrode connected to said the other one of the two adjacent cell sets.

7. The photovoltaic module according to claim 5, wherein a width of the conductive connection element located on the first rear insulating layer and the second rear insulating layer of the cell set increases gradually from a side away from said the other one of the two adjacent cell sets to a side close to said the other one of the two adjacent cell sets.

8. The photovoltaic module according to claim 1, wherein in each cell set, the first cell further comprises a first conductive sheet electrically connected to the second electrode, the second cell further comprises a second conductive sheet electrically connected to the fourth electrode.

9. The photovoltaic module according to claim 1, wherein a material of the conductive connection element comprises aluminum, copper, tin, lead, steel, gold, silver, iron, graphite or a combination thereof.

10. The photovoltaic module according to claim 1, wherein in each cell set, a polarity of the first electrode is different from a polarity of the second electrode, a polarity of the third electrode is different from a polarity of the fourth electrode, and the polarity of the second electrode is the same as the polarity of the fourth electrode.

11. The photovoltaic module according to claim 1, wherein the first insulating layer and the second insulating layer are an insulating paste, an insulating sheet or an insulating coating.

12. The photovoltaic module according to claim 1, wherein each of the first semiconductor stack and the second semiconductor stack comprises a first type doped semiconductor layer and a second type doped semiconductor layer, the first type doped semiconductor layer of the first semiconductor stack is disposed between the first electrode and the second type doped semiconductor layer of the first semiconductor stack, and the second type doped semiconductor layer of the first semiconductor stack is disposed between the first type doped semiconductor layer of the first semiconductor stack and the second electrode, the first type doped semiconductor layer of the second semiconductor stack is disposed between the third electrode and the second type doped semiconductor layer of the second semiconductor stack, and the second type doped semiconductor layer of the second semiconductor stack is disposed between the first type doped semiconductor layer of the second semiconductor stack and the fourth electrode, one of the first type doped semiconductor layer and the second type doped semiconductor layer is a p-type semiconductor layer, and the other one of the first type doped semiconductor layer and the second type doped semiconductor layer is an n-type semiconductor layer.

13. The photovoltaic module according to claim 1, wherein the conductive connection element disposed between the first electrode and the third electrode has a flexible structure.

14. The photovoltaic module according to claim 13, wherein the flexible structure comprises a V-shaped structure or a sine waveform structure in at least a portion.

15. A photovoltaic module, comprising at least one cell set, each cell set comprising:
 a first cell, comprising:
  a first semiconductor stack, having a first surface, a second surface opposite to the first surface, and a first side surface connecting the first surface with the second surface;
  a first electrode, disposed on the first surface;
  a second electrode, disposed on the second surface; and
  a first insulating layer, comprising a first side insulating layer disposed on the first side surface and a first rear insulating layer disposed on the second surface, wherein the first side insulating layer and the first rear insulating layer are multiple layers;
 a second cell, comprising:
  a second semiconductor stack, having a third surface, a fourth surface opposite to the third surface, and a second side surface connecting the third surface with the fourth surface;
  a third electrode, disposed on the third surface;
  a fourth electrode, disposed on the fourth surface; and
  a second insulating layer, comprising a second side insulating layer disposed on the second side surface and a second rear insulating layer disposed on the fourth surface, wherein the second side insulating layer and the second rear insulating layer are multiple layers;
 a conductive connection element, extending along the first side surface from the first surface toward the second surface, connecting the first rear insulating layer with the first electrode, and connecting the second rear insulating layer with the third electrode, wherein the conductive connection element extends along the first rear insulating layer and the first side insulating layer in sequence, is then bent toward the second cell, and then extends along the second side insulating layer and the second rear insulating layer in sequence, a part of the conductive connection element is between the first cell and the second cell, and two other parts of the conductive connection element are on a side of the second surface and on a side of the fourth surface respectively;
 a first conductive paste, connecting the conductive connection element with the first electrode; and
 a second conductive paste, connecting the conductive connection element with the third electrode,
 wherein a polarity of the first electrode is the same as a polarity of the third electrode.

\* \* \* \* \*